US005495247A

United States Patent [19]
Yamamoto et al.

[11] Patent Number: 5,495,247
[45] Date of Patent: Feb. 27, 1996

[54] ANALOG TO DIGITAL CONVERTOR

[75] Inventors: Katsuyosi Yamamoto; Toshitaka Mizuguchi, both of Kawasaki, Japan

[73] Assignee: Fujitsu Limited, Kawasaki, Japan

[21] Appl. No.: 109,515

[22] Filed: Aug. 20, 1993

[30] Foreign Application Priority Data

Aug. 20, 1992 [JP] Japan ................... 4-221459

[51] Int. Cl.$^6$ .................................. H03M 1/36
[52] U.S. Cl. ........................... 341/159; 341/131
[58] Field of Search ................... 341/131, 159, 341/156

[56] References Cited

U.S. PATENT DOCUMENTS

| | | | |
|---|---|---|---|
| 4,884,075 | 11/1989 | Mangelsdorf | 341/159 |
| 4,924,227 | 5/1990 | Mangelsdorf | 341/159 |
| 4,928,103 | 5/1990 | Lane | 341/159 |
| 5,051,746 | 9/1991 | van de Grift et al. | 341/159 |
| 5,157,397 | 10/1992 | Vernon | 341/157 |
| 5,164,728 | 11/1992 | Matsuzawa et al. | 341/159 |
| 5,225,837 | 7/1993 | Hosotani et al. | 341/159 |
| 5,291,198 | 3/1994 | Dingwall et al. | 341/159 |

*Primary Examiner*—Marc S. Hoff
*Attorney, Agent, or Firm*—Staas & Halsey

[57] ABSTRACT

There are provided n signal processing units for sampling an analog signal based on n [references] reference voltages, k intermediate signal processing units for comparing two intermediate signals outputted from two adjacent signal processing units in n signal processing units, and an encoder for coding logical output values of the signal processing unit and the intermediate signal processing unit. One signal processing unit includes a differential amplifier, a comparison circuit and logic circuit, and one intermediate signal processing unit includes another comparison circuit and another logic circuit. As a result, when an analog signal is applied to the signal processing unit, a reciprocal of a potential difference between a reference voltage and an analog signal is increased by a gain [times] G, and [the] an intermediate signal is outputted to the comparison circuit of the intermediate signal processing unit. Further, comparison signals of the comparison circuit of the signal processing unit and the comparison circuit of the intermediate signal processing unit are quantized by the logic circuit of the signal processing unit, and comparison signals of the comparison circuit of the intermediate signal processing unit and the comparison circuit of the signal processing unit are quantized by the logic circuit of the intermediate signal processing unit. With this, n+k logical output signals quantized by the logic circuits of n signal processing units and the logic circuits of k intermediate signal processing units are coded by the encoder, thus obtaining a digital output signal in N bits.

12 Claims, 10 Drawing Sheets

ANALOG TO DIGITAL CONVERTOR

BACKGROUND OF THE INVENTION

1. Field of the Invention

The present invention relates to an analog to digital convertor (hereinafter referred to as an A/D convertor) for converting an analog signal to a digital signal, and more particularly to a circuit constitution of an analog to digital convertor having high resolution.

2. Description of the Related Art

An A/D convertor of high resolution of 9 bits or more is demanded in recent years due to high integration and high density of a semiconductor device. This is for the purpose of processing various data digitally so as to reproduce them with high tone quality and high picture quality in various audio equipment, picture processing devices and so on.

For example, an N-bit flash type A/D convertor is composed of a plurality of reference resistors, comparators, logic circuits, encoders and so on. An analog signal is sampled, quantized and flash encoded flush based on a reference voltage. As a result, when, an A/D convertor of 9 bits or more is being constituted, each of the plurality of comparators for comparing the analog signal with the reference voltage have to be made to have a resolution of 9 bits or more. When an A/D convertor is presumed to be constituted by combining differential amplifiers of low resolution with one another, it is impossible to obtain an error in conversion-precision at ±0.5 [LSB] or less.

A related art example of an analog to digital convertor will now be described. For example, a flash type 9-bit A/D convertor is composed of $2^N-2=510$ reference resistors R1 to R510, $2^N-1=511$ comparators C1 to C511, $2^N-1=511$ two-input AND circuits (hereinafter referred to as NAND circuits) A1 to A511 and an encoder 1 and an output buffer 2. The reference resistors R1 to R510 are connected in series, and the resistor R1 is connected to a voltage source VRT. The resistor R510 is connected to a voltage source VRB.

The function of the above-described A/D convertor is such that, when 511 reference voltages V1 to V511 are generated by the reference resistors R1 to R510, an analog signal VIN is compared with reference voltage V1 based on a predetermined clock signal in the comparator C1 for instance, and the comparison signal is outputted to the NAND circuit A1. Further, in the comparator C2, the analog signal VIN and the reference voltage V2 are compared with each other, and the comparison signal thereof is outputted to two NAND circuits A1 and A2, respectively.

Furthermore, in the comparator C3, the analog signal VIN is compared with the reference voltage V3 based on the predetermined clock signal, and the comparison signal thereof is outputted to the NAND circuits A2 and A3, respectively.

In a similar manner thereafter, the analog signal VIN and the reference voltage V510 are compared with each other by the comparator C510, and the comparison signal thereof is outputted to the NAND circuits A509 and A510. Further, in the comparator C511, the analog signal VIN and the reference voltage V511 are compared with each other, and the comparison signal thereof is outputted to the NAND circuits A510 and A511.

With this, a digital output signal DOUT is generated in the encoder 1 based on the logical output values of 511 NAND circuits A1 to A511, and is amplified and outputted by the output buffer 2.

SUMMARY OF THE INVENTION

It is an object of the present invention to perform analog to digital conversion with high resolution even when differential amplifiers of low resolution are combined with one another by devising the constitution of a comparison circuit for comparing an analog signal with a reference voltage.

It is a second object of the present invention to relax the resolution all of signal processing units for comparing the analog signal with the reference voltage and intermediate signal processing units to the resolution of N−1 bits without making the resolution N bits or more when an A/D convertor of N bits or more is being constituted.

It is a third object of the present invention to provide a high speed analog to digital conversion processing by reducing reference resistors connected to input portions of the differential amplifiers.

It is a fourth object of the present invention to relax offset voltages of respective comparison circuits so as to ensure the error in conversion-precision at ±0.5 [LSB] or below.

Namely, an A/D convertor according to the present invention is provided with, in a preferred embodiment, n signal processing units for sampling an analog signal based on n reference voltages, k intermediate signal processing units for comparing two intermediate signals outputted from two adjacent signal processing units among n signal processing units and an encoder for coding logical output values of the signal processing units and the intermediate signal processing units.

Further, one signal processing unit includes a differential amplifier, a comparison circuit and a logic circuit. A first and a second output portions of the differential amplifier are connected to a first and a second input portions of the comparison circuit, an output portion of the comparison circuit is connected to a first input portion of the logic circuit, an analog signal is inputted to a first input portion of the differential amplifier, and reference voltage is supplied to a second input portion of the differential amplifier.

Furthermore, the intermediate signal processing unit includes another comparison circuit and logic circuit. A first input portion of the comparison circuit thereof is connected to a junction of a second output portion of the differential amplifier of the signal processing unit and a second input portion of the comparison circuit of the signal processing unit, a second input portion of the comparison circuit of the intermediate signal processing unit is connected to a junction of a first output portion of the differential amplifier of the signal processing unit and a first input portion of the comparison circuit of the signal processing unit, and the output portion of the comparison circuit is connected to a first input portion of the logic circuit and a second input portion of the logic circuit of the signal processing unit.

By adopting a structure described above, when an analog signal is supplied to the signal processing unit, n+k logical output signals quantized in logic circuits of n signal processing units and logic circuits of k intermediate signal processing units are coded by an encoder, thus obtaining a digital output signal in N bits. Namely, a differential amplifier of signal processing unit n, where n is an arbitrary number, amplifies the difference voltage between reference voltage and input analog signal to give a positive output characteristic and a negative output characteristic.

A comparison circuit of the intermediate signal processing unit compares a noninverting intermediate amplified signal and an inverting intermediate amplified signal using the middle voltage as a new reference voltage to a new compared resulting signal.

Accordingly, n signal processing units output n compared resulting signals. And n−1 comparators produce new n−1 compared resulting signals.

In such a manner, it is possible to output 2n−1 compared resulting signals from n reference voltages and n signal processing units.

With this, when an A/D convertor of N bits or more is being constituted, the resolution of respective comparison circuits is relaxed to N−1 bits without requiring all of the comparison circuits for comparing an analog signal with the reference voltage of the signal processing unit and the comparison circuits of the intermediate signal processing unit to have resolution of N bits or higher.

DESCRIPTION OF THE PREFERRED EMBODIMENTS

Figure 1:
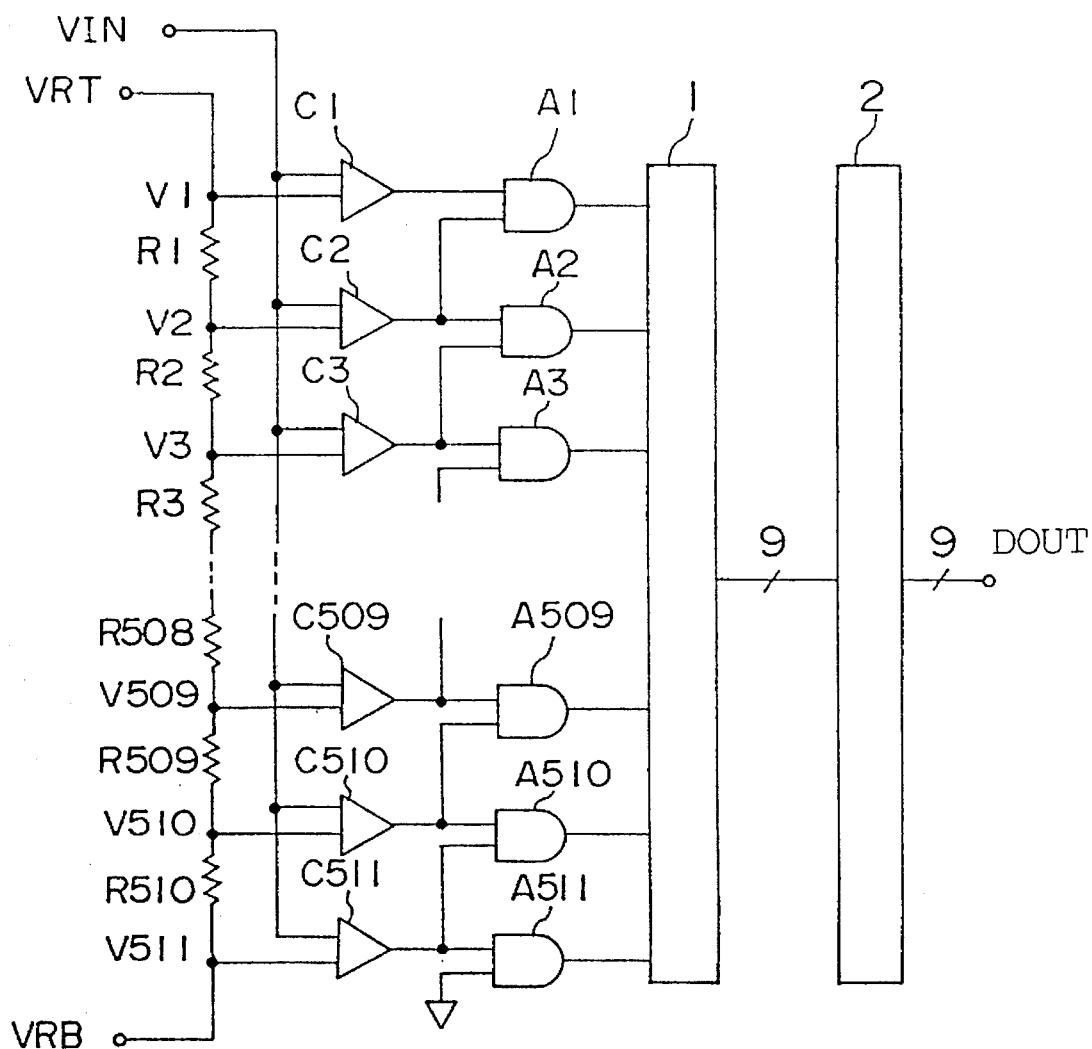
FIG. 1 is a block diagram of a related art A/D convertor.

The flash type [9-bit] A/D convertor according to a related art of the present invention is composed of 510 reference resistors R1 to R510, 511 comparators C1 to C511, 511 pieces of NAND circuits A1 to A511, an encoder 1 and an output buffer 2. The operation thereof is performed in such a way that an analog signal VIN is sampled, quantized and coded based on reference voltages V1 to V511.

As a result, when an A/D convertor of 9 bits or more is being constituted, the resolution of all 511 comparators C1 to C511 for comparing the analog signal VIN with reference voltages V1 to V511 has to be 9 bits or more. This is due to the fact that offset voltages of the comparators C1 to C511 determine precision characteristics of the A/D convertor.

For example, when an analog to digital conversion range is assumed to be 2 [V] in a flash type 9-bit A/D convertor, 1-step voltage (1 [LSB]) becomes approximately 4 [mV]. The 1-step voltage (1 [LSB]) means voltage related to the sampling of the analog signal VIN. Besides, in order to keep an error in conversion-precision of converting the analog signal VIN into the digital signal DOUT at ±0.5 [LSB] or lower, the offset voltages of the comparators C1 to C511 have to be controlled to 2 [mV] or lower.

This fact depends on the conversion-precision of individual differential output transistors-comprising the comparators C1 to C511. For example, it is required to make the dispersion of a base-to-emitter potential VBE of the transistor very small, and a bipolar transistor circuit of high precision is needed.

When a 9-bit A/D convertor is constituted by combining differential amplifiers of low resolution by a constitution method of a related art of the present invention, it is impossible to make an error in conversion-precision ±0.5 [LSB] or less. Further, deterioration of the reliability of the A/D convertor is incurred. Thus, the allowable range of dispersion in manufacturing of the transistor is reduced. As a result, the production yield thereof is lowered.

Further, as the result that 510 pieces of reference resistors R1 to R510 for generating reference voltages V1 to V511 are connected to the input portions of the comparators C1 to C511, such a problem is caused that the input capacity thereof becomes larger, thus preventing high-speed operation of the analog to digital conversion.

Figure 2:
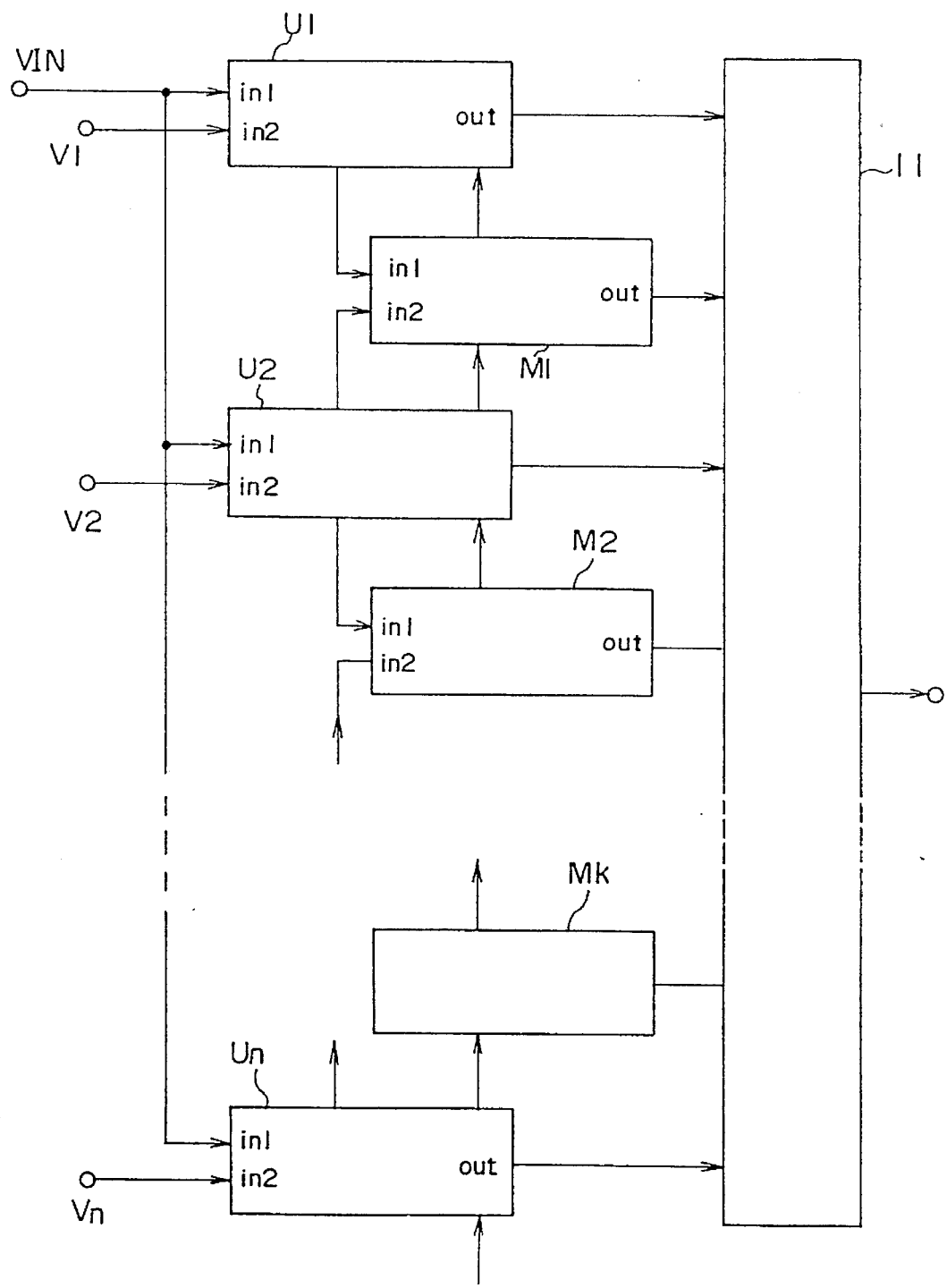
FIG. 2 is a principal diagram of an A/D convertor according to the present invention.

In contrast to the above, as shown in FIG. 2 a first A/D convertor according to the principal of the present invention is provided with n signal processing units Un [n=1, 2, 3, . . . , i, j, . . . , $2^{N-1}$] for sampling the analog signal VIN based on n reference voltages Vn [n=$2^{N-1}$, N=1, 2, 3 . . . ], k intermediate signal processing units Mk [k=n±1] for comparing two intermediate signals outputted from two adjacent signal processing units Ui and Uj among the n signal processing units Un and an encoder 11 for coding logical output values of the signal processing unit Un and the intermediate signal processing unit Mk as shown in FIG. 2.

Figure 3:
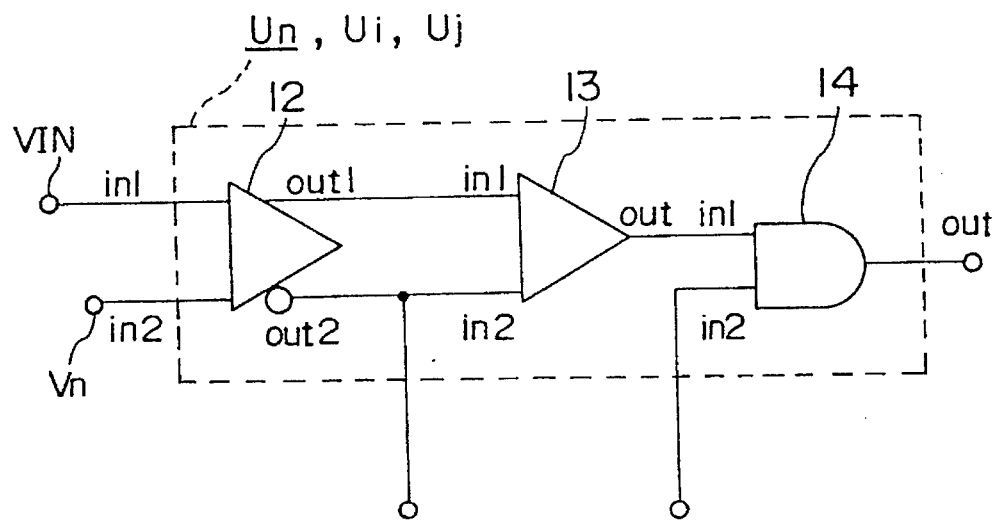
FIG. 3(A) is a block diagram of a signal processing unit of the A/D convertor shown in FIG. 2.
FIG. 3(B) is a block diagram of an intermediate signal processing unit of the A/D convertor shown in FIG. 2.
Figure 3:
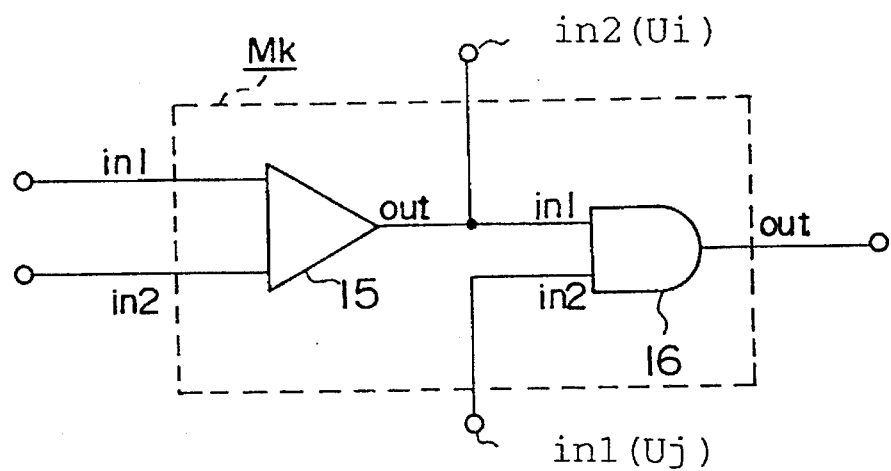

Further, as shown in FIG. 3(A), in a first A/D convertor of the present invention, one signal processing unit Un comprises a differential amplifier 12, a comparison circuit 13 and a logic circuit 14. A first output terminal out1 of the differential amplifier 12 is connected to a first input terminal in1 of the comparison circuit 13, and a second output terminal out2 of the differential amplifier 12 is connected to a second input terminal in2 of the comparison circuit 13, respectively. An output terminal out of the comparison circuit 13 is connected to a first input terminal in1 of the logic circuit 14, an analog signal VIN is inputted to a first input terminal in1 of the differential amplifier 12, and a reference voltage Vn is supplied to a second input terminal in2 of the differential amplifier 12.

Further, as shown in FIG. 3(B) in the first A/D convertor in principal of the present invention, an intermediate signal processing unit Mk comprises a comparison circuit 15 and a logic circuit 16. A first input terminal in1 of the comparison circuit 15 is connected to a junction of the second output terminal out2 of the differential amplifier 12 of the signal processing unit Ui and the second input terminal in2 of the comparison circuit 13 of the signal processing unit Ui. A second input terminal in2 of the comparison circuit 15 of the intermediate signal processing unit Mk is connected to a junction of the first output terminal out1 of the differential amplifier 12 of the signal processing unit Uj and the first input terminal in1 of the comparison circuit 13 of the signal processing unit Un. An output terminal out of the comparison circuit 15 is connected to an input terminal in1 of the logic circuit 16 and a second input terminal in2 of the logic circuit 14 of the signal processing unit U1.

Figure 4:
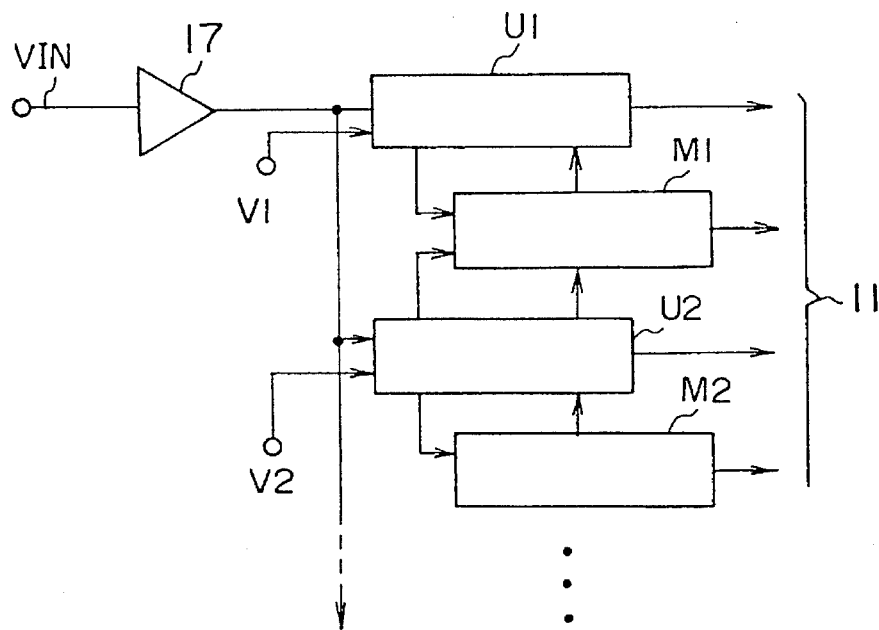
FIG. 4(A) is a principal diagram of another A/D convertor according to the present invention.
FIG. 4(B) is a block diagram of another signal processing unit of respective A/D convertors shown in FIG. 2 and FIG. 4(A)
FIG. 4(C) is a block diagram of a differential amplifier applied to the signal processing unit and the intermediate signal processing unit shown in FIGS. 3(A) and (B) and FIG. 4(A)
Figure 4:
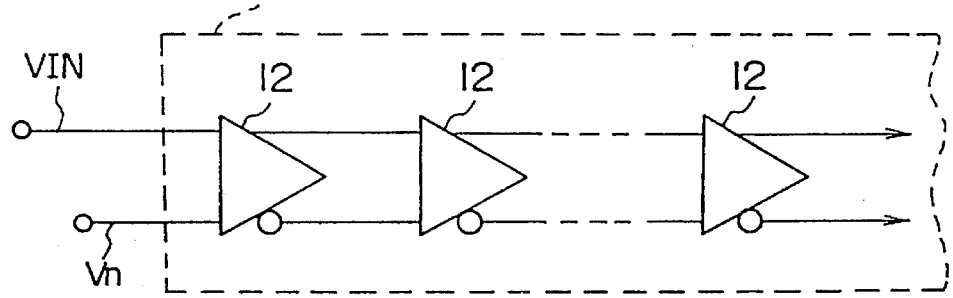
Figure 4:
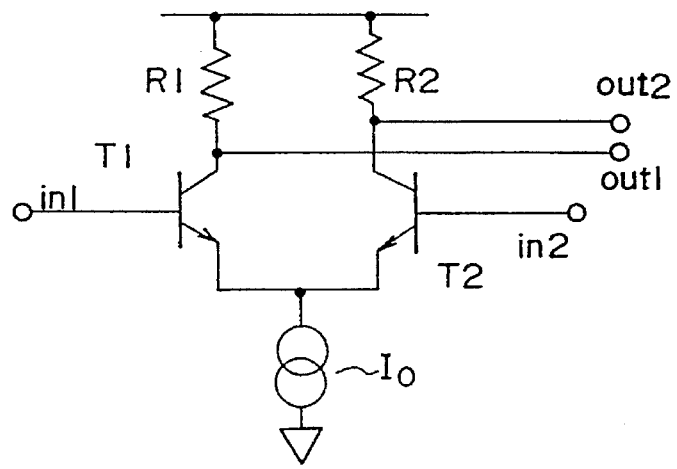

Furthermore, the differential amplifier 12, the comparison circuit 13 of the signal processing unit Un and the comparison circuit 15 of the intermediate signal processing unit Mk are comprised of differential output transistors T1 and T2, bias elements R1 and R2 and a constant current source Io, respectively, as shown in FIG. 4(C).

Next, the operation of the first A/D convertor in principal of the present invention will be described. For instance, the analog signal VIN is supplied to the first to the nth signal processing units U1 to Un, an intermediate amplified signal (hereinafter to as an intermediate signal) obtained by multiplying a reciprocal potential difference between the reference voltage V1 and the analog signal VIN by a gain G, e.g., a non-inverting amplified signal is outputted to the comparison circuit 13 of the first signal processing unit U1 by the differential amplifier 12 of the first signal processing unit U1, and the inverted signal thereof is outputted to the comparison circuit 15 of the first intermediate signal processing unit M1.

Further, an intermediate signal obtained by multiplying a reciprocal potential difference between the reference voltage V2 and the analog signal VIN by a gain G, e.g., the non-inverted signal is outputted to the comparison circuit 13 of the second signal processing unit U2 by the differential amplifier 12 of the signal processing unit U2, and the inverted signal thereof is outputted to the comparison circuit 15 of the second intermediate signal processing unit M2. With this, the comparison signals of the comparison circuit 13 of the first signal processing unit U1 and the comparison circuit 15 of the first intermediate signal processing unit M1 are quantized by the logic circuit 14 of the first signal processing unit U1, and the comparison signals of the comparison circuit 15 of the first intermediate signal processing unit M1 and the comparison circuit 13 of the second signal processing unit U2 are quantized by the logic circuit 16 of the first intermediate signal processing unit M1.

Furthermore, an intermediate signal obtained by multiplying a reciprocal potential difference between the reference voltage V3 and the analog signal VIN by a gain G, e.g., the non-inverted signal thereof is outputted to the comparison circuit 13 of the third signal processing unit U3 by the differential amplifier 12 of the signal processing unit U3, and the non-inverted signal thereof is outputted to the comparison circuit 15 of the third intermediate signal processing unit M3. With this, the comparison signals of the comparison circuit 13 of the second signal processing unit U2 and the comparison circuit 15 of the second intermediate signal processing unit M2 are quantized by the logic circuit 14 of the second signal processing unit U2, and the comparison signals of the comparison circuit 15 of the second intermediate signal processing unit M2 and the comparison circuit 13 of the third signal processing unit U3 are quantized by the logic circuit 16 of the second intermediate signal processing unit M2.

In a similar manner thereafter, an intermediate signal obtained by multiplying a reciprocal potential difference between the reference voltage Vn and the analog signal VIN by a gain G, e.g., the inverted signal thereof is outputted to the comparison circuit 13 of the nth signal processing unit Un by the differential amplifier 12 of the nth signal processing unit Un, and the inverted signal thereof is outputted to the comparison circuit 15 of the kth intermediate signal processing unit Mk. With this, the comparison signals of the comparison circuit 13 of the nth signal processing unit Un and the comparison circuit 15 of the kth intermediate signal processing unit Mk are quantized by the logic circuit 14 of the nth signal processing unit Un, and the comparison signals of the comparison circuit 15 of the kth intermediate signal processing unit Mk and the comparison circuit 13 of the nth signal processing unit Un are quantized by the logic circuit 16 of the kth intermediate signal processing unit Mk.

With this, n+k logical output signals quantized in the logic circuits 14 of n signal processing units U1 to Un and in the logic circuits 16 of k intermediate signal processing units M1 to Mk are coded by the encoder 11, thus obtaining a digital output signal DOUT in N bits.

Namely, a differential amplifier of an n-th signal processing unit amplifies the difference voltage between reference voltage V(n) and input analog signal to give a positive output characteristic $Q(n)$ and a negative output characteristic $\overline{Q(n)}$.

A comparison circuit of intermediate signal processing unit compares a noninverting intermediate amplified signal $Qn$ and an inverting intermediate amplified signal $\overline{Qn-1}$ using the middle voltage as a new reference voltage to a new compared resulting signal.

Accordingly, n signal processing units output n compared resulting signals. And n−1 comparators produce new n−1 compared resulting signals.

In such a manner, it is possible to output 2n−1 compared resulting signals from n reference voltages V(n) and n signal processing units.

As a result, when an A/D convertor is being constituted, it becomes possible to relax the comparison circuits 13 and 15 to have the resolution of N−1 bits without making all of the comparison circuits 13 of the signal processing unit Un for comparing the analog signal VIN with the reference voltages V1 to Vn and the comparison circuits 15 of the intermediate signal processing unit Mk to have the resolution of N bits or more.

When the range of analog to digital conversion is assumed to be 2 [V] when a flush type A/D convertor of N=9 bits is being constituted, the 1-step voltage (1 [LSB]) becomes approximately 4 [mV] according to the related art, but it is possible to make the 1-step voltage (1 [LSB]) to 4×G [mV] which is obtained by multiplying it by a gain G of the differential amplifier 12 according to the present invention.

With this, it is possible to ensure the error in conversion-precision at ±0.5 [LSB] or less without deteriorating precision characteristics of the A/D convertor. Further, it is possible to relax the offset voltage of the comparison circuits 13 and 15 to 4G/2 [mV].

Furthermore, in a second A/D convertor in principal of the present invention, a sample and hold circuit 17 for processing the analog signal VIN is connected to the first A/D convertor as shown in FIG. 4(A).

As a result, for example, the waveform of the analog signal VIN is shaped in a step form by the sample and hold circuit 17, and the analog signal VIN in a step form is supplied through the first to the nth signal processing units U1 to Un. With this, similarly to the first A/D convertor, n+k logical output signals quantized by the logic circuits 14 of n signal processing units U1 to Un and the logic circuits 16 with k intermediate signal processing units M1 to Mk are coded by the encoder 11, thus obtaining the digital output signal DOUT in N bits.

With this, it becomes possible to perform analog to digital conversion processing of higher precision as compared with the first A/D convertor.

Further, in a third A/D convertor in principal of the present invention, one or more of differential amplifiers 12 of the signal processing unit Un are connected in series in the front stage of the comparison circuit 13 as shown in FIG. 4(B).

For example, when two differential amplifiers 12 are connected in series at the front stage of the comparison circuit 13 of the signal processing unit Un, the gain G thereof is increased. With this, it is possible to make 1-step voltage (1 [LSB]) to show a voltage value which depends on gain G times of two stage portions of the differential amplifiers 12.

As a result, it is possible to ensure the error in conversion-precision at ±0.5 [LSB] or less without deteriorating precision characteristics of the A/D convertor, and to further relax the offset voltage of the comparison circuits 13 and 15.

Furthermore, in a fourth A/D convertor in accordance with the principal of the present invention, the signal processing unit Un comprises a plurality of comparison circuits 13 which output two or more intermediate signals, and the intermediate signal processing unit Mk is comprised of a plurality of comparison circuits 15 which output three or more comparison signals based on two or more high order intermediate signals and two or more low order intermediate signals.

Thus, it is possible to constitute a first stage of the signal processing unit Un with the comparison circuit 13 having resolution of 7 bits, to constitute a second stage of the signal processing unit Un and the initial stage of the intermediate signal processing unit Mk with comparison circuits 13 and 15 having resolution of 8 bits, and further to constitute the third stage of the signal processing unit Un and the following stage of the intermediate signal processing unit Mk with the comparison circuits 13 and 15 having resolution of 9 bits.

With this, it becomes possible to constitute an A/D convertor having resolution of 9 bits or more on the level of conversion-precision of individual differential output transistor constituting the differential amplifier 12 and the comparison circuit 13 of the signal processing unit Un and the comparison circuit 15 of the intermediate signal processing unit Mk.

(1) DESCRIPTION OF FIRST PREFERRED EMBODIMENT

Figure 5:
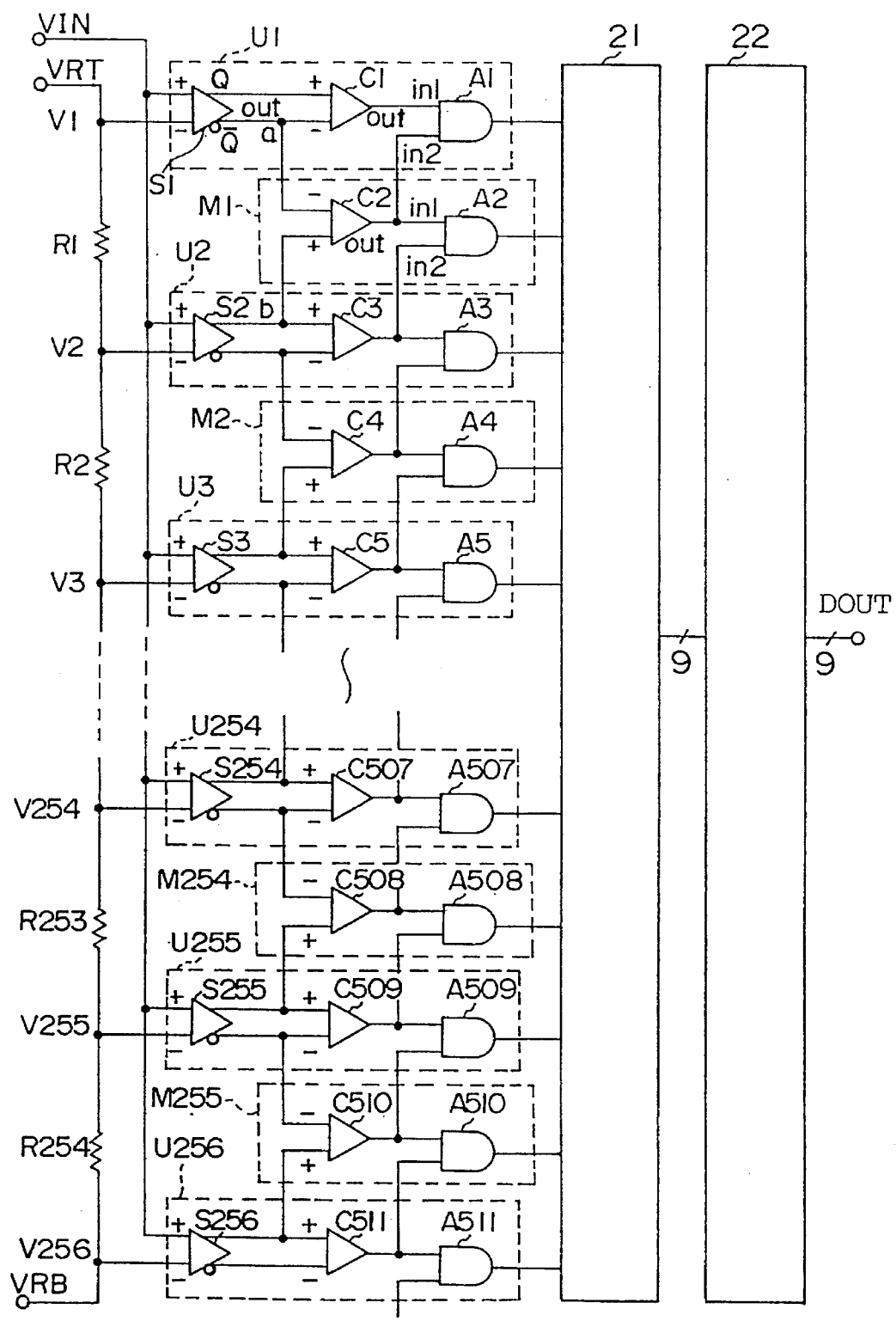
FIG. 5 is a block diagram of a preferred A/D convertor according to a first embodiment of the present invention.

For example, a flash type A/D convertor of N=9 bits is comprised of 256 signal processing units U1 to U256, 255 intermediate signal processing units M1 to M255, an encoder 21 and an output buffer 22 as shown in FIG. 5.

Namely, the signal processing units U1 to U256 represent an embodiment of n signal processing units Un [$n=2^{N-1}$, which samples the analog signal VIN based on n=256 reference voltages V1 to V256. Besides, 256 reference voltages V1 to V256 are generated by 254 reference resistors R1 to R254. The reference resistors R1 to R254 are connected in series between voltage sources VRT and VRB.

Further, the signal processing unit U1 is comprised of a differential buffer S1 which becomes an example of the differential amplifier 12, a comparator C1 which becomes an example of the comparison circuit 13, and a two-input AND circuit (hereinafter referred to simply as a NAND circuit) A1 which becomes an example of the logic circuit 14. Non-inverted and inverted terminals are connected to non-inverted and inverted input terminals of the comparator C1. An analog signal VIN is inputted to the non-inverted input terminal of the differential buffer S1, and the reference voltage V1 is supplied to the inverted input terminal thereof.

Furthermore, an output terminal $\overline{\text{out}}$ of the comparator C1 is connected to an input terminal $\overline{\text{in1}}$ of a NAND circuit A1, and an input terminal in2 of the NAND circuit A1 is connected to an output terminal $\overline{\text{out}}$ of a comparator C2 of the intermediate signal processing unit M1.

The intermediate signal processing units M1 to M255 represent a case of k=255. The units M1 to M255 are circuits for comparing intermediate signals Q and $\overline{Q}$ with each other. These intermediate signals are outputted from two signal processing units U1 and U2, U2 and U3 and so on. Those two units U1, U2 or U2, U3 are adjacent to each other among the 256 signal processing units U1 to U256.

Further, the intermediate signal processing unit M1 is comprised of a comparator C2 which becomes an example of the comparison circuit 15 and a NAND circuit A2 which becomes an example of the logic circuit 16. The inverted input terminal of the comparator C2 is connected to a junction a. The junction a is a connecting portion of the inverted output terminal of the differential amplifier 12 of the signal processing unit U1 and the inverted input terminal of the comparator C1 of the signal processing unit U1.

The non-inverted input terminal of the comparator C2 of the intermediate signal processing unit M1 is connected to a junction b. The junction b is a connecting portion of a non-inverted output terminal of the differential amplifier 12 of the signal processing units U2 and a non-inverted input terminal of the comparator C3 of the signal processing unit U2. An output terminal $\overline{\text{out}}$ of the comparator C2 is connected to the input portion in1 of the NAND circuit A2 and the input terminal in2 of the logic circuit 14 of the signal processing unit U1.

Figure 6A:
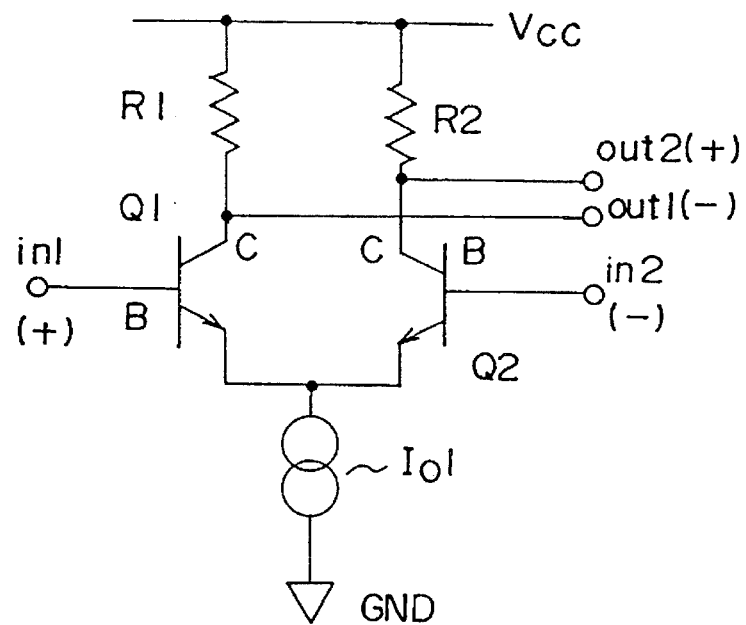
FIG. 6(A) is a block diagram of a differential buffer applied to a signal processing unit of the A/D convertor shown in FIG. 5.

The differential buffer S1 of the signal processing unit U1 is comprised of npn bipolar transistors Q1 and Q2, resistor elements R1 and R2 and a constant current source Io1 as shown in FIG. 6(A). The transistors Q1 and Q2 represent examples of differential output transistors T1 and T2, and are connected between a power source line VCC and a ground line GND. The resistor elements R1 and R2 represent examples of bias elements R1 and R2.

The base of the transistor Q1 is connected to the non-inverted input terminal, and the base of the transistor Q2 is connected to the inverted input terminal. The reciprocal intermediate signals Q and $\overline{Q}$ are outputted from respective collectors of both transistors Q1 and Q2.

Figure 6B:
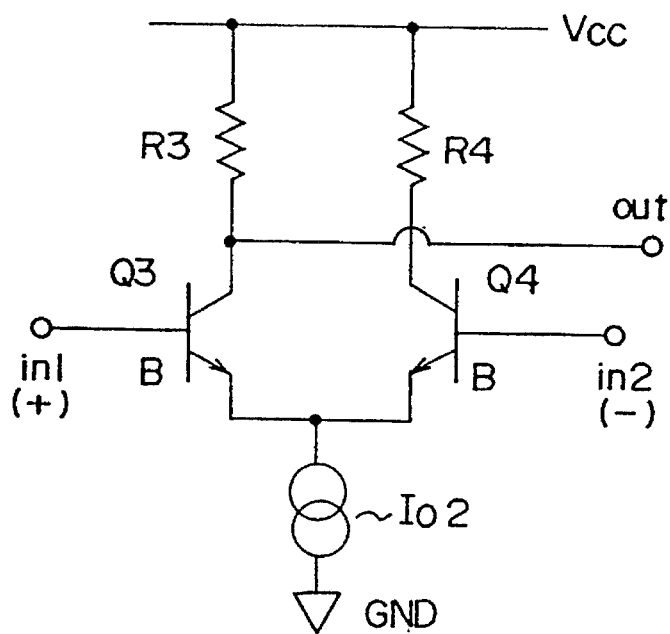
FIG. 6(B) is a block diagram of a comparator applied to an intermediate signal processing unit of the A/D convertor shown in FIG. 5.

Further, each of the comparator C1 of the signal processing unit U1 and the comparator C2 of the intermediate signal processing unit M1 is comprised of npn bipolar transistors Q3 and Q4, resistor elements R3 and R4 and a constant current source Io2 as shown in FIG. 6(B). The transistors Q3 and Q4 represent another example of the differential output transistors T1 and T2, and are connected between the power source line VCC and the ground line GND. The resistor elements R3 and R4 represent other examples of bias elements R1 and R2.

The base of the transistor Q3 is connected to the non-inverted input terminal, and the base of the transistor Q4 is connected to the inverted input terminal. The comparison signal is outputted from the collector of the transistor Q3.

The signal processing unit U2 is comprised of a differential buffer S2, a comparator C3 and a NAND circuit A3. The intermediate signal processing unit M2 is comprised of a comparator C4 and a NAND circuit A4. In a similar manner thereafter, the remaining 253 signal processing units U3 to U256 are comprised of differential buffers S3 to S256, odd-numbered comparators and NAND circuits. The remaining 252 intermediate signal processing units M2 to M255 are comprised of even-numbered comparators and NAND circuits.

In such a manner, an A/D convertor according to the first embodiment of the present invention is constituted of 256 signal processing units U1 to U256, 255 intermediate signal processing units M1 to M255 and an encoder 22. The units U1 to U256 are comprised of differential buffers S1 to S256, odd-numbered comparators and NAND circuits, and the units M1 to M255 are comprised of even-numbered comparators and NAND circuits.

As a result, when the analog signal VIN is supplied to the signal processing units U1 to U256, intermediate signals Q and $\bar{Q}$ obtained by multiplying by G by the differential :buffer S1 of the signal processing unit U1 are outputted to the intermediate signal processing unit M1. The differential buffer S1 amplifies the difference between the reference voltage V1 and the analog signal VIN. For example, the intermediate signal Q is outputted to the comparator C1 of the signal processing unit U1, and the signal $\bar{Q}$ is outputted to the comparator C2.

Further, the intermediate signals Q and $\bar{Q}$ obtained by multiplying by G by the differential buffer S2 of the signal processing unit U2 are outputted to the intermediate signal processing unit M2. The differential buffer S2 amplifies the difference between the reference voltage V2 and the analog signal VIN. For example, the intermediate signal Q is outputted to the comparator C3 of the signal processing unit U2, and the signal $\bar{Q}$ is outputted to the comparator C4.

With this, a comparison signal is quantized by the NAND circuit A1 of the signal processing unit U1. This comparison signal expresses the result of comparison between the comparator C1 of the signal processing unit U1 and the comparator C2 of the intermediate signal processing unit Mi. Further, another comparison signal is quantized by the NAND circuit A2 of the intermediate signal processing unit M1. Another comparison signal at this time expresses the result of comparison between the comparator C2 of the intermediate signal processing unit M1 and the comparator C3 of the signal processing unit U2.

Furthermore, the intermediate signals Q and $\bar{Q}$ obtained by multiplying by G by the differential buffer S3 of the signal processing unit U3 are outputted to the intermediate signal processing unit M3. The differential buffer S3 amplifies the difference between the reference voltage V3 and the analog signal VIN. For example, the intermediate signal Q is outputted to the comparator C5 of the signal processing unit U3, and the signal $\bar{Q}$ is outputted to the comparator C6.

With this, the comparison signal is quantized by the NAND circuit A1 of the signal processing unit U2. This comparison signal represents the result of comparison between the comparator C4 of the signal processing unit U2 and the comparator C6 of the intermediate signal processing unit M2. Further, another comparison signal is quantized by the NAND circuit A4 of the intermediate signal processing unit M2. Another comparison signal at this time represents the result of comparison between the comparator C4 of the intermediate signal processing unit M2 and the comparator C5 of the signal processing unit U3.

In a similar manner thereafter, the intermediate signals Q and $\bar{Q}$ obtained by multiplying by G by the differential buffer S256 of the signal processing unit U256 are outputted to the kth intermediate signal processing unit Mk. The differential buffer S256 amplifies the difference between the reference voltage V256 and the analog signal VIN. For example, the intermediate signal Q is outputted to the comparator C511 of the signal processing unit U256, and the signal $\bar{Q}$ is outputted to the intermediate signal processing unit M255.

With this, the comparison signal is quantized by the NAND circuit A510 of the intermediate signal processing unit M255. This comparison signal represents the result of comparison between the comparator C511 of the signal processing unit U256 and the comparator C510 of the intermediate signal processing unit M255. The output result signal of the comparator C511 of the signal processing unit U256 is quantized by the NAND circuit A511 of the signal processing unit U256.

As a result, 511 logical output signals quantized by the NAND circuits A1 to A511 of 256 signal processing units U1 to U256 and 255 intermediate signal processing units M255 are coded by the encoder 22, thus obtaining a digital output signal DOUT.

With this, it becomes possible to relax the resolution to 8 bits without raising the resolution of all of the odd-numbered comparators C of the signal processing units U1 to U256 for comparing the analog signal VIN with the reference voltages V1 to V256 and the even-numbered comparators C of the intermediate signal processing units M1 to M255 to 9 bits or more even in case an A/D convertor of 9 bits or more is constituted.

Figure 7:
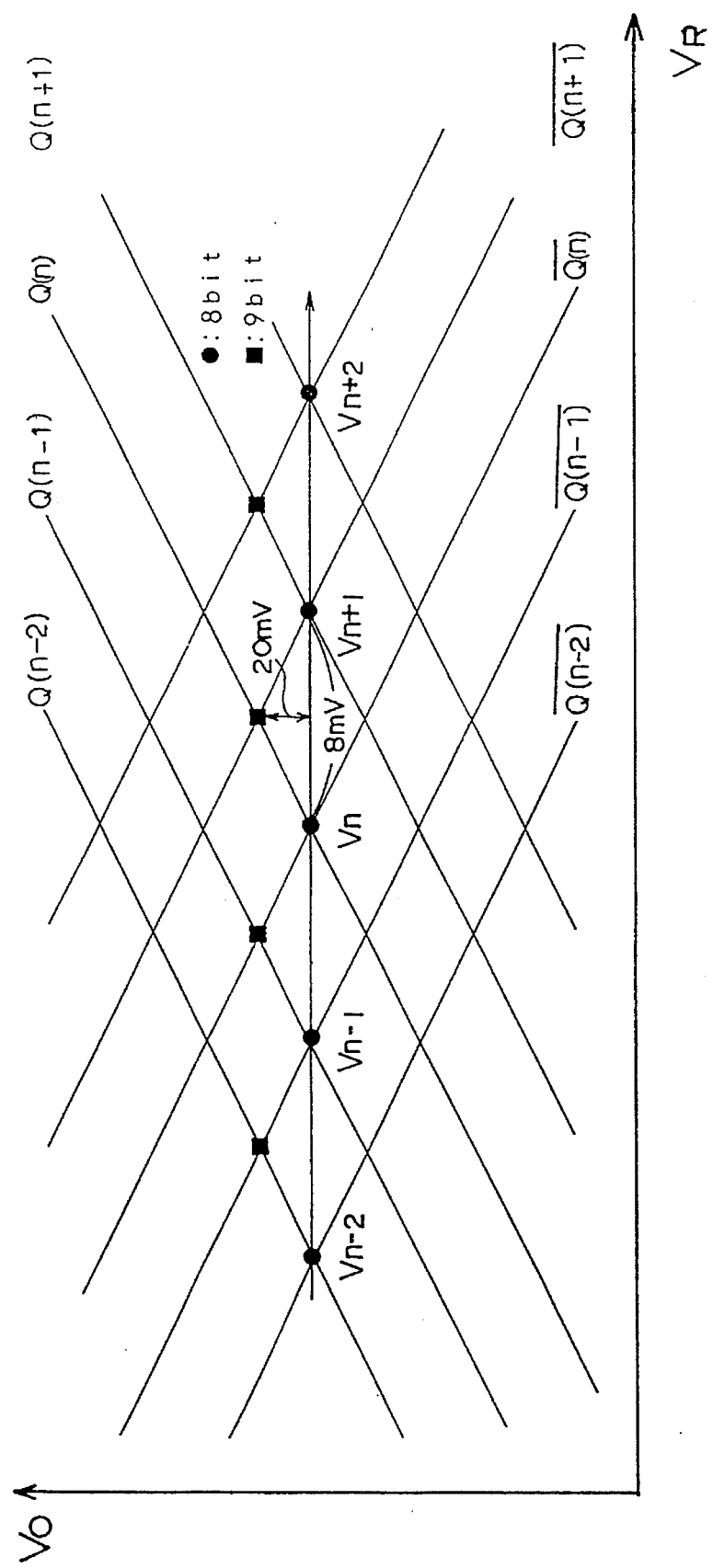
FIG. 7 is an operational explanatory diagram of a preferred A/D convertor according to the first embodiment of the present invention.

Namely, when it is assumed that the range of analog to digital conversion is 2 [V], 1-step voltage (1 [LSB]) becomes approximately 4 [mV] according to a related art of the present invention. Whereas, it is possible to make 1-step voltage (1 [LSB]) as high as five times thereof, i.e., 20 [mV] when the gain G of the differential buffer Sn is assumed to be G=5 for instance as shown in FIG. 7 according to the present invention.

Here, the operating principal of the A/D convertor of the invention is explained with reference to FIG. 7. The axis of abscissas shows a reference voltage VR to an input of differential buffer and the axis of ordinates shows a output voltage VO of the differential buffer. And each of oblique lines shows respectively an output characteristic of a differential buffer of each of five signal processing units.

A differential buffer of an n-th signal processing unit amplifies the difference voltage between reference voltage V(n) and input analog signal to Give a positive output characteristic Q(n) and a negative output characteristic $\bar{Q}(n)$.

Q(n) is a noninverting intermediate amplified signal and $\bar{Q}(n)$ is a inverting intermediate amplified signal.

A round mark(V(n)) shows an input voltage of an n-th differential buffer and a square mark shows an intersecting point between Q(n) and Q(n+1). The voltage of the intersecting point is a middle voltage between Vn and Vn+1.

A comparator of intermediate signal processing unit compares a noninverting intermediate amplified signal Q(n) and an inverting intermediate amplified signal $\bar{Q}$(n−1) using the middle voltage as a new reference voltage to a new compared resulting signal.

Accordingly, n signal processing units output n compared resulting signals. And n−1 comparators produce new n−1 pieces compared resulting signals.

In such a signals manner, it is possible to output 2n−1 compared resulting signals from n reference voltages V(n) and n signal processing units.

Besides, as shown in FIG. 7, a round mark shows a switching point of 8 bits, where 1-step voltage (1 [LSB]) is 8 [mV]. A square mark shows a switching point of 9 bits, where 1-step voltage (1 [LSB]) is 20 [mV]. This voltage becomes the input voltage applied to the comparator. In order to obtain such characteristics, output loads of respective differential buffers and comparators are made equal to one another. For example, lengths of wirings and capacities on the output side are distributed symmetrically.

With this, it is possible to ensure the error in conversion-precision at ±0.5 [LSB] or less without deteriorating precision characteristics of the A/D convertor, and to relax the offset voltage of odd-numbered comparators of the signal processing units U1 to U256 and even-numbered comparators of the intermediate signal processing units M1 to M255 to 10 [mV].

With the above, it becomes possible to expand the allowable range of the offset voltage of the comparator by a large margin, thus making it possible to constitute an A/D convertor by combining differential buffers of low resolution. This fact relaxes the allowable range of dispersion in production of the transistor. As a result, improvement of production yield can be aimed at.

Further, 511 reference resistors R1 to R511 have been required according to a related art of the present invention. Whereas, it is sufficient to connect about half of the reference resistors R1 to R254 to the input terminals of the differential buffers S1 and so on according to the present invention. As a result, the input capacity becomes about half as compared with the related art of the present invention, thus making it possible to aim at high speed operation of the analog to digital conversion.

With this, it becomes possible to manufacture an A/D convertor of high precision with respect to differential output transistors Q1 to Q4 constituting differential buffers and comparators without requiring the level of 9-bit resolution like the related art of the present invention. Further, it is possible to aim at reduction in cost.

(2) DESCRIPTION OF SECOND PREFERRED EMBODIMENT

Figure 8A:
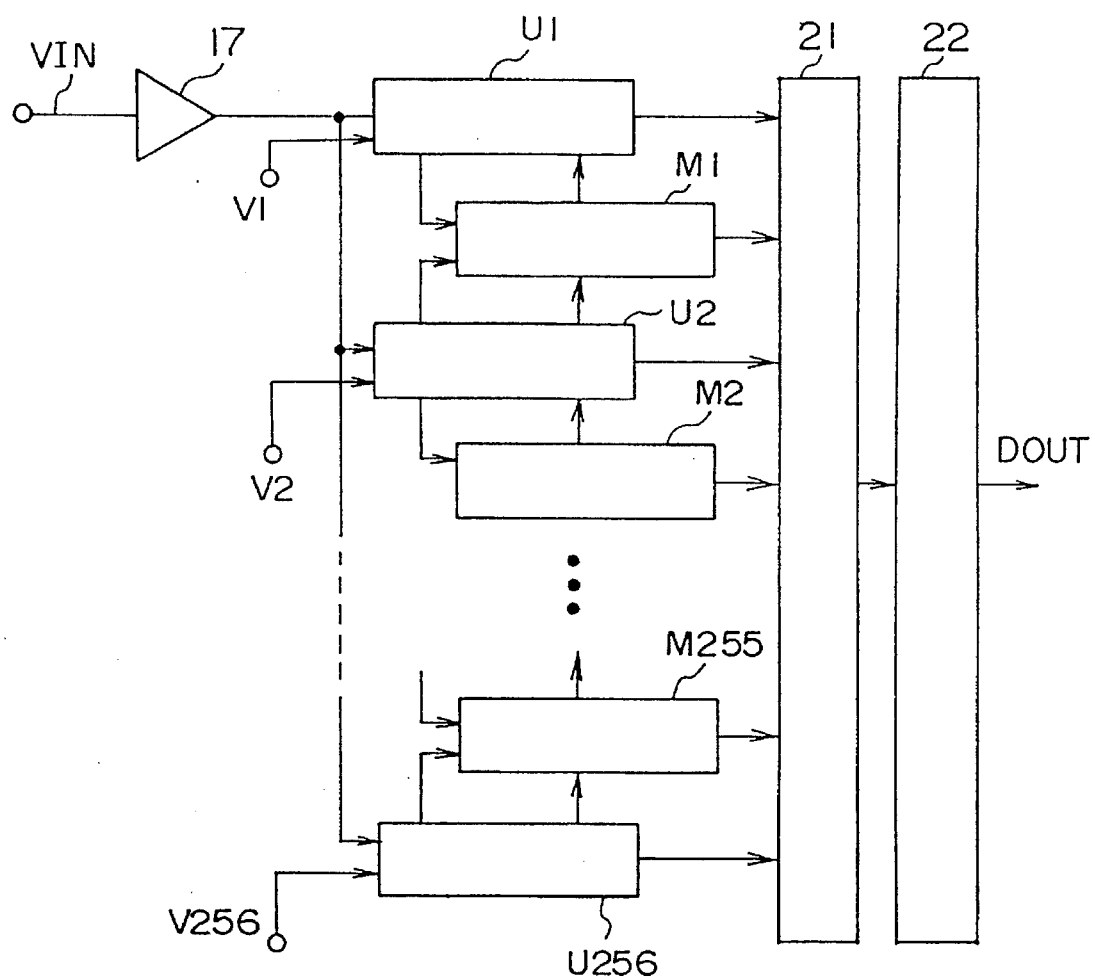
FIG. 8(A) is a block diagram of a preferred A/D convertor according to a second embodiment of the present invention.

The second embodiment differs from the first embodiment in that the second embodiment includes a sample and hold circuit 17 for processing the analog signal VIN connected as shown in FIG. 8(A).

Figure 8B:
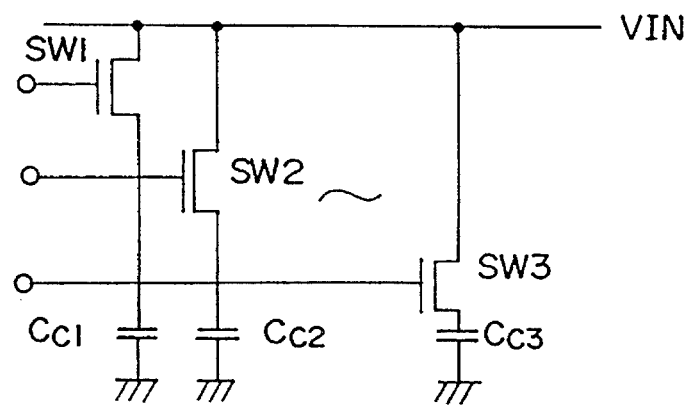
FIG. 8(B) is a block diagram of a sample and hold circuit of the A/D convertor shown in FIG. 8(A)

Namely, as shown in FIG. 8(A), the sample and hold circuit 17 is provided at the front stage of the signal processing units U1 to U256. The circuit 17 shapes the waveform of the analog signal VIN, and supplies it to the differential buffer S. For example, the sample and hold circuit 17 is comprised of switching elements SW1 to SW3 and capacitor elements $C_{C1}$ to $C_{C3}$ as shown in FIG. 8(B).

Further, each of the switching elements SW1 to SW3 is comprised of an n-type field effect transistor for instance, and the gate G thereof is controlled. With this, the analog signal VIN is shaped stepwise. Since other constitutions are similar to that of the first embodiment, the description thereof is omitted.

Thus, the sample and hold circuit 17 is connected to the A/D convertor according to the first preferred embodiment as shown in FIG. 8(A) with respect to the A/D convertor according to the second preferred embodiment of the present invention.

As a result, the analog signal VIN in which the waveform is shaped stepwise is supplied to respective signal processing units U1 to U256 from the sample and hold circuit 17. With this, similarly to the first embodiment, 511 logical circuit signals quantized in NAND circuits A1 to A511 of 256 signal processing units U1 to U256 and 255 intermediate signal processing units M1 to M255 are coded by the encoder 22, thus obtaining a digital output signal DOUT. Besides, it becomes possible to perform analog to digital conversion of high precision as compared with the first embodiment.

(3) DESCRIPTION OF THIRD PREFERRED EMBODIMENT

Figure 9:
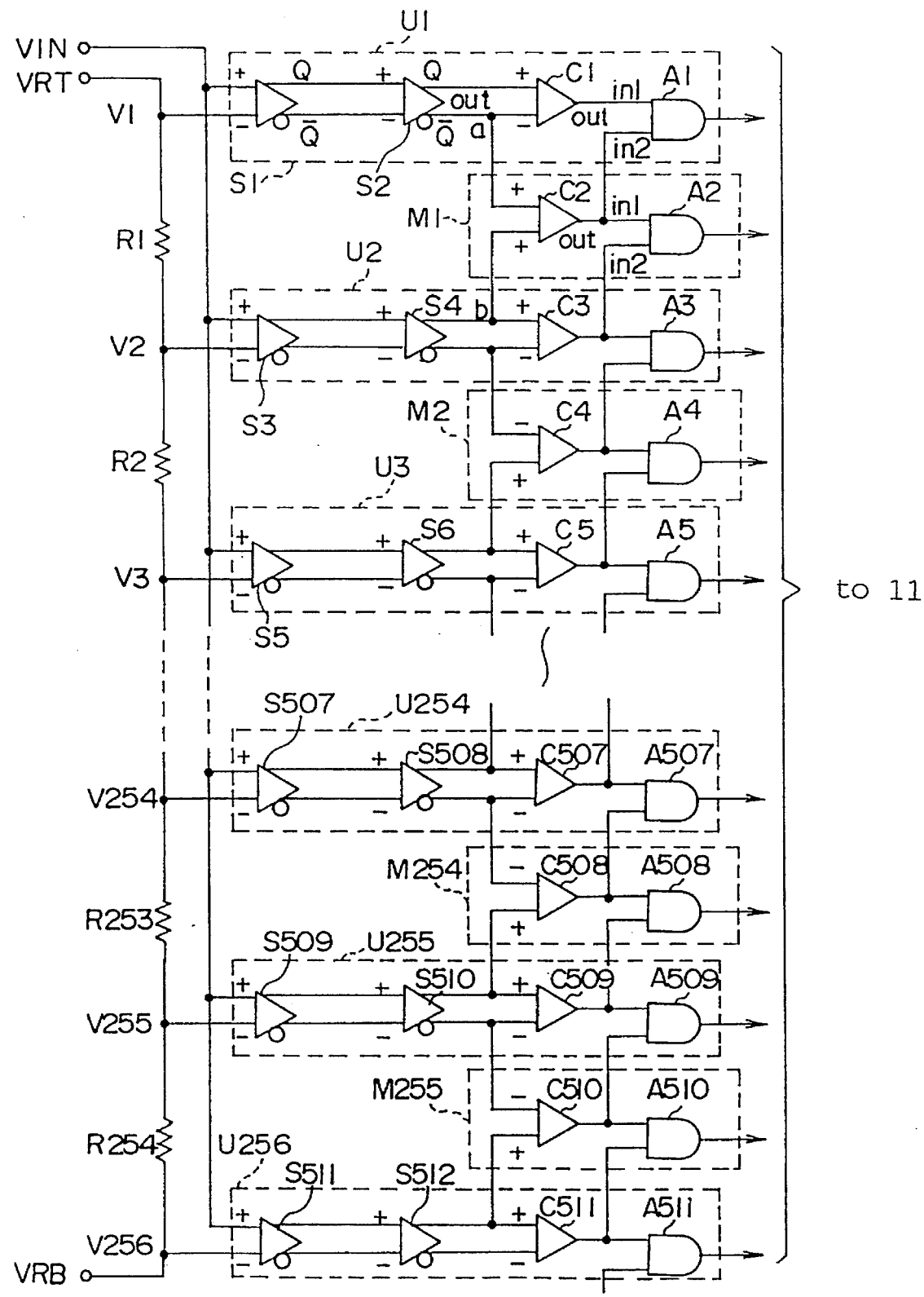
FIG. 9 is a block diagram of a preferred A/D convertor according to a third embodiment of the present invention.

The third embodiment differs from the first and the second embodiments in that the third embodiment includes differential buffers of two stages are connected in series in respective processing units U1 to U256 as shown in FIG. 9.

Namely, as shown in FIG. 9, a signal processing unit U1 is comprised of two differential buffers S1 and S2, one comparator C1 and one piece of NAND circuit A1 which represent an example of the differential amplifier 12. The non-inverted output terminal of the differential buffer S1 is connected to the noninverted input terminal of the differential buffer S2, and the non-inverted output terminal of the differential buffer S2 is connected to the non-inverted input terminal of the comparator C1. The inverted output terminal of the differential buffer S1 is connected to the inverted input terminal of the differential buffer S2, and the inverted output terminal of the differential buffer S2 is connected to the inverted input terminal of the comparator C1.

The analog signal VIN is inputted to the noninverted input terminal of the differential buffer S1, and the reference voltage V1 is applied to the inverted input terminal thereof. Since other components is similar to those of the first and the second embodiments, description thereof is omitted.

As described above, in the A/D convertor according to the third embodiment of the present invention, differential buffers S1 and S2, S3 and S4, . . . , S511 and S512 are connected in series at the front stage of respective odd-numbered comparators in the signal processing units U1 to U256 as shown in FIG. 9.

As a result, the signal gain at the front stage of the comparator of respective signal processing units is increased the two of differential buffers S1 and S2 being connected in series. Thus, it is possible to make 1-step voltage (1 [LSB]) related to sampling of the analog signal VIN to show a voltage value which depends on the gain [G times] of two stage portions.

With this, it is possible to ensure the error in conversion-precision at ±0.5 [LSB] or less without deteriorating precision characteristics of the A/D convertor. The offset voltages of odd-numbered comparators of the signal processing units U1 to U256 and even-numbered comparators of the intermediate signal processing units M1 to M255 are relaxed by a large margin.

(4) DESCRIPTION OF FOURTH PREFERRED EMBODIMENT

Figure 10:
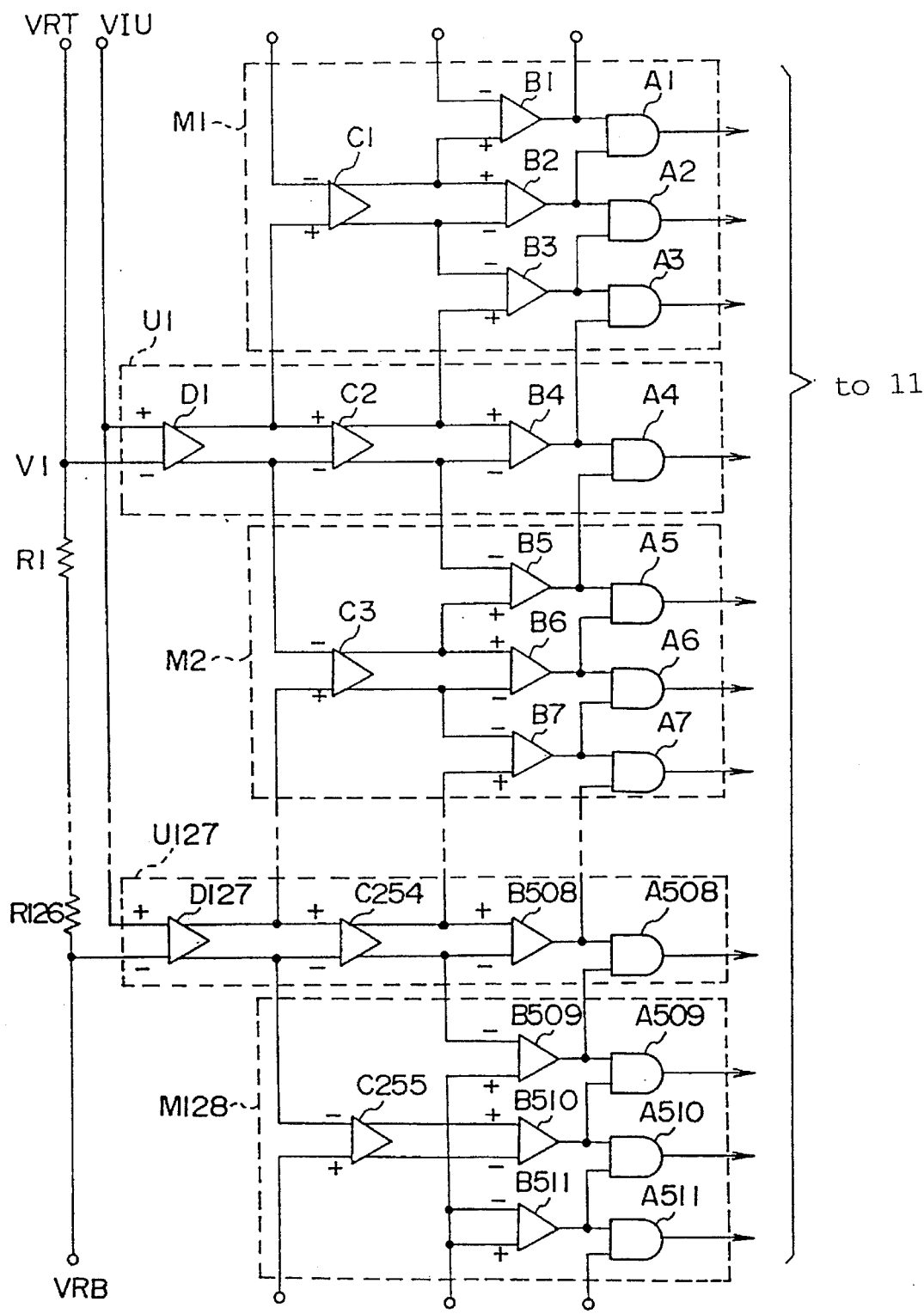
FIG. 10 is a block diagram of a preferred A/D convertor according to a fourth embodiment of the present invention.

The fourth embodiment differs from the first, the second and the third embodiments in that the fourth preferred embodiment exists in the case of n=127 in the signal processing units U1 to U127 as shown in FIG. 10. In the units U1 to U127, comparators Ci and Bj are connected in series in two stages. Further, k=128 in the intermediate signal processing units M1 to M128, and four comparators Ci and Bj are provided.

Namely, as shown in FIG. 10, the intermediate signal processing unit M1 is comprised of four comparators C1 and B1 to B3 and three NAND circuits A1 to A3. The non-inverted input terminal of the comparator C1 is connected to the non-inverted output terminal of the comparator D1 of the signal processing unit U1. The non-inverted output terminal of the comparator C1 is connected to non-inverted input terminals of the comparators B1 to B2 at the following stage, respectively. The inverted output terminal of the comparator C1 is connected to inverted input terminals of the comparators B2 to B3 at the following stage, respectively.

The output terminals of respective comparators B1 to B3 are connected to the input terminals on one side of three NAND circuits A1 to A3, and the output terminals of the comparators B2 and B3 are connected to other input terminals of the NAND circuits A1 and A2, respectively.

Furthermore, the signal processing unit U1 is comprised of three comparators D1, C2 and B4 and one NAND circuit A4. The non-inverted output terminal of the comparator D1 is connected to the non-inverted input terminal of the comparator C2, and the non-inverted output terminal of the comparator C2 is connected to the noninverted input terminal of the comparator B4, respectively.

The inverted output terminal of the comparator D1 is connected to the inverted input terminal of the comparator C2, and the inverted output terminal of the comparator C2 is connected to the inverted input terminal of the comparator B4, respectively.

The non-inverted output terminal of the comparator D1 is connected to the non-inverted input terminal of the comparator C1 of the intermediate signal processing unit M1 and the non-inverted input terminal of the comparator C2. The non-inverted output terminal of the comparator C2 is connected to the non-inverted input terminal of the comparator C1 of the intermediate signal processing unit M1, and further, the output terminal of the comparator B4 is connected to another input terminal of the NAND circuit A3 of the intermediate signal processing unit M1. The analog signal VIN is inputted to the non-inverted input terminal of the comparator D1, and the reference voltage V1 is applied to the inverted input terminal thereof.

Similarly, the intermediate signal processing unit M2 is comprised of four comparators C3 and B5 to B7 and three NAND circuits A5 to A7. The non-inverted input terminal of the comparator C3 is connected to the inverted input terminal of the comparator D1 of the signal processing unit U1.

The non-inverted output terminal of the comparator C3 is connected to the non-inverted input terminals of the comparators B5 to B7 at the following stage, and the inverted output terminal of the comparator C3 is connected to the inverted input terminals of the comparators B5 to B7 at the following stage, respectively. The output terminals of respective comparators B5 to B7 are connected to the input terminals on one side of three NAND circuits A5 to A7, and the output terminals of the comparators B6 and B7 are connected to another input terminals of the NAND circuits A5 and A6.

In a similar manner thereafter, the intermediate signal processing unit M128 is comprised of four comparators C255 and B509 to B511 and three NAND circuits A509 to A511. The non-inverted input terminal of the comparator C255 is connected to the inverted input terminal of the comparator D127 of the signal processing unit U127.

The non-inverted output terminal of the comparator C255 is connected to the non-inverted input terminals of the comparators B509 to B511 at the following stage, respectively, and the inverted output terminal of the comparator B255 is connected to the inverted input terminals of the comparators B509 to B511 at the following stage, respectively. The output terminals of respective comparators B509 to B511 are connected to the input terminals on one side of three NAND circuits A509 to A511, and the output terminals of the comparators B510 and B511 are connected to other input terminals of the NAND circuits A509 and A510.

Since other components are similar to those of the first, the second and the third embodiments, description thereof is omitted.

As described, in the A/D convertor according to the fourth embodiment of the present invention, each of the signal processing units U1 to U127 is comprised of three comparators Dn, Ci and Bj and one NAND circuit Ak as shown in FIG. 10, and each of the intermediate signal processing units M1 to M128 is comprised of three comparators Ci and Bj and three NAND circuits Ak. Further, three comparators Dn, Ci and Bj output two complementary intermediate signals, and three comparators Dn, Ci and Bj output three comparison signals based on two complementary 10 high order intermediate signals and two complementary low order intermediate signals.

Thus, it is possible to constitute a first stage of the signal processing units U1 to U127 with comparators Cn of resolution of 7 bits, and to constitute a second stage of the signal processing units U1 to U127 and an initial stage of the intermediate signal processing units M1 to M128 with comparators Ci of resolution of 8 bits. Besides, it is sufficient to constitute comparators Bj at the third stage of the signal processing units U1 to U127 and at the following stage of the intermediate signal processing units M1 to M128 with resolution of 9 bits.

Further, it is possible to make 1-step voltage (1 [LSB]) a voltage value which depends on the gain [G times] of 2 to 3 stage portions of the comparators Dn, Ci and Bj due to the fact that the gain G is increased. 1-step voltage (1 [LSB]) is voltage related to sampling of the analog signal VIN.

Thus, it is possible to ensure the error in conversion-precision at ±0.5 [LSB] or less without deteriorating precision characteristics of the A/D convertor, and to further relax the offset voltage of the comparators Dn, Ci and Bj.

With this, it is possible to constitute the signal processing units U1 to U127, the intermediate signal processing units M1 to M128 and so on with differential output transistors on low levels. Further, it becomes possible to constitute an A/D convertor having resolution of 9 bits or more on that level.

It is a matter of course that various modifications are possible in the present invention. For example, it is also possible to constitute differential amplifiers and comparators with n-type and p-type field effect transistors as occasion demands. Further, when load states on the output sides of respective circuits are made symmetrical, a method of bypassing a wiring is adopted sometimes in order to adjust the length of the wiring depending on the layout of the transistor. Accordingly, all of the modifications existing within the true spirit and the scope of the present invention are included in the scope of claims.

What is claimed is:

1. An analog to digital convertor comprising:

(a) a reference power source producing a plurality of different reference voltages;

(b) a plurality of signal processing units including (1) a differential amplifier circuit for amplifying the difference between one of the reference voltages and an analog signal supplied from a signal source to output an inverting intermediate amplified signal and a noninverting intermediate amplified signal, and (2) a first comparison circuit for comparing the inverting intermediate amplified signal with the noninverting intermediate amplified signal to output a first compared resulting signal;

(c) a plurality of intermediate signal processing units including a second comparison circuit for comparing one of the inverting intermediate amplified signal and the noninverting intermediate amplified signal directed obtained from the differential amplifier circuit of an n-th signal processing unit, where n is an arbitrary number, with one of the noninverting intermediate amplified signal and the inverting intermediate amplified signal directly obtained from the differential amplifier circuit of an (n+1)th signal processing unit adjoining the n-th signal processing unit to output a second compared resulting signal; and (d) an encoder for coding the first compared resulting signals of the signal processing units and the compared resulting signals of the intermediate signal processing units.

2. An analog to digital convertor according to claim 1, wherein at least one differential amplifier is connected in series at a front stage of the comparison circuit of said signal processing unit.

3. An analog to digital convertor according to claim 1, wherein a sample and hold circuit is connected to the input of the differential amplifier circuit of the signal processing unit.

4. An analog to digital convertor according to claim 1, wherein each of the differential amplifier circuit and the first comparison circuit of said signal processing units and the second comparison circuit of said intermediate signal processing units are comprised of differential output transistors, bias elements and a constant current source.

5. An analog to digital convertor according to claim 1, wherein the differential amplifier circuit and first comparison circuit of said signal processing units and the second comparison circuits of said intermediate signal processing units are comprised of differential output transistors which include one of bipolar transistors and field effect transistors.

6. An analog to digital convertor according to claim 1, wherein a load connected to the output sides of the differential amplifiers and the comparison circuits of said signal processing unit is equal to a load connected to the output sides of the comparison circuits of said intermediate signal processing unit.

7. An analog to digital convertor comprising:

(a) a reference power source producing a plurality of different reference voltages;

(b) a plurality of signal processing units including (1) a first differential amplifier for amplifying the difference between one of the reference voltages and an analog signal supplied from a signal source to output a first inverting intermediate amplified signal and a first noninverting intermediate amplified signal, (2) a second differential amplifier for amplifying the first inverting intermediate amplified signal and the first noninverting intermediate amplified signal to output a second inverting intermediate amplified signal and a second noninverting intermediate amplified signal, and (3) a first comparison circuit for comparing the second inverting intermediate amplified signal with the second noninverting intermediate amplified signal to output a first compared resulting signal;

(c) a plurality of intermediate signal processing units including (1) a third differential amplifier for amplifying one of the first inverting intermediate amplified signal and the first noninverting intermediate amplified signal directly obtained from the first differential amplifier of an n-th signal processing unit, where n is an arbitrary number, with one of the first noninverting intermediate amplified signal and the first inverting intermediate amplified signal directly obtained from the first differential amplifier of an (n+1)th signal processing unit adjoining the n-th signal processing unit to output a third inverting intermediate amplified signal and a third noninverting intermediate amplified signal, (2) a second comparison circuit for comparing the third inverting intermediate amplified signal with the third noninverting intermediate amplified signal to output a second compared resulting signal, (3) a third comparison circuit for comparing one of the second inverting intermediate amplified signal and the second noninverting intermediate amplified signal from the second differential amplifier of the n-th signal processing unit with one of the third noninverting intermediate amplified signal and the third inverting intermediate amplified signal from the third differential to output a third compared resulting signal, and (4) a fourth comparison circuit for comparing one of the third inverting intermediate amplified signal and the third noninverting intermediate amplified signal from the third differential amplifier with one of the second noninverting intermediate amplified signal and the second inverting intermediate amplified signal from the second differential amplifier of the (n+1)th signal processing unit adjoining the n-th signal processing unit to output a fourth compared resulting signal; and (d) an encoder for coding the compared resulting signals of the signal processing units and the compared resulting signals of the intermediate signal processing units.

8. An analog to digital convertor according to claim 7, wherein at least one differential amplifier is connected in series at a front stage of said first to the fourth comparison circuit.

9. An analog to digital convertor according to claim 7, wherein a sample and hold circuit is connected in the input of the first differential amplifier of the signal processing unit.

10. An analog to digital convertor according to claim 7, wherein each of the first to the third differential amplifiers and the first to the fourth comparison circuits are comprised of differential output transistors, bias elements and a constant current source.

11. An analog to digital convertor according to claim 7, wherein each of the first to the third differential amplifiers and the first to the fourth comparison circuits are comprised of one of bipolar transistors and field effect transistors.

12. An analog to digital convertor according to claim 7, wherein a load connected to the output sides of the differential amplifiers and the comparison circuits of said signal processing unit is equal to a load connected to the output sides of the comparison circuits of said intermediate signal processing unit.

* * * * *

UNITED STATES PATENT AND TRADEMARK OFFICE
CERTIFICATE OF CORRECTION

PATENT NO. : 5,495,247  Page 1 of 2
DATED :
INVENTOR(S) : February 27, 1996

Yamamoto KATSUYOSI et al.

It is certified that error appears in the above-indentified patent and that said Letters Patent is hereby corrected as shown below:

On the title page

Item [57], in the Abstract, line 2, delete "[reference]"; and line 14, delete "[times]" and "[the]".

Column 1, line 23, delete "flush".

Column 2, line 15, after "bits" insert --,--.

Column 7, line 10, delete "of" and insert --with-- therein; and line 62, after "[n = $2^{N-1}$" insert --]--.

Column 9, line 29, change "Q" to --$\overline{Q}$--;

line 44 change "Mi" to --M1--

UNITED STATES PATENT AND TRADEMARK OFFICE
CERTIFICATE OF CORRECTION

PATENT NO. : 5,495,247
DATED : February 27, 1996
INVENTOR(S) : Yamamoto KATSUYOSI et al.

It is certified that error appears in the above-indentified patent and that said Letters Patent is hereby corrected as shown below:

Column 10, line 51, change "Give" to --give--.

Column 14, line 22, delete "10".

Signed and Sealed this

Twenty-fifth Day of June, 1996

Attest:

BRUCE LEHMAN

*Attesting Officer*     *Commissioner of Patents and Trademarks*